US007181023B1

(12) United States Patent
Andrews et al.

(10) Patent No.: US 7,181,023 B1

(45) Date of Patent: Feb. 20, 2007

(54) DISTRIBUTED STEREO SYSTEM

(75) Inventors: Leonard Colin Andrews, Alexandria (AU); Andrew Chartres Goldfinch, Bondi Junction (AU)

(73) Assignee: Leisure Tech Electronics Pty., Ltd. (AU)

( * ) Notice: Subject to any disclaimer, the term of this patent is extended or adjusted under 35 U.S.C. 154(b) by 0 days.

(21) Appl. No.: 09/485,657

(22) PCT Filed: Aug. 14, 1998

(86) PCT No.: PCT/AU98/00647

§ 371 (c)(1), (2), (4) Date: Mar. 24, 2000

(87) PCT Pub. No.: WO99/09787

PCT Pub. Date: Feb. 25, 1999

(30) Foreign Application Priority Data

Aug. 15, 1998 (AU) .................................... PO 8621

(51) Int. Cl.
*H03B 3/00* (2006.01)

(52) U.S. Cl. ............................ 381/77; 381/79; 381/80

(58) Field of Classification Search .................. 381/77, 381/79, 80; 700/94; 439/577
See application file for complete search history.

(56) References Cited

U.S. PATENT DOCUMENTS 3,195,067 A 7/1965 Klein et al.
3,370,125 A 2/1968 Shaw et al.
4,490,683 A 12/1984 Rhee
4,733,389 A * 3/1988 Puvogel ........................ 370/200
4,809,339 A 2/1989 Shih et al.
4,984,931 A 1/1991 Struthers et al.

(Continued)

FOREIGN PATENT DOCUMENTS

DE 44 34 469 5/1995

(Continued)

OTHER PUBLICATIONS

Mutli-room hi-fi takes control of the home; by Lloyd, May 1995, pp1-2.*

(Continued)

*Primary Examiner*—Xu Mei
(74) *Attorney, Agent, or Firm*—Kenneth M. Fagin, Esq.

(57) ABSTRACT

This invention concerns a distributed stereo audio system (1). Distributed stereo audio systems are used to provide stereo sound to several rooms or areas from a single source of signal. The system includes two or more speakers (2, 3) for the broadcast of stereo audio signals; a source of stereo audio signals; a stereo amplifier (4) to amplify stereo audio signals and drive the speakers; and a mains operated electrical power supply (10) to provide power to the amplifier. The amplifier is located in the same room as the speakers, and remote from the signal source and power supply. The amplifier is connected to the signal source and power supply by means of a category 5 four pair twisted cable (11) which provides, in respective twisted pairs, right channel audio signals (12) from the signal source to the amplifier, left channel audio (13) from the signal source to the amplifier, DC power (14) from the power supply to the amplifier, and control signals (20) from the amplifier to the signal source.

25 Claims, 2 Drawing Sheets

U.S. PATENT DOCUMENTS

| | | | | |
|---|---|---|---|---|
| 4,991,221 | A | 2/1991 | Rush | |
| 5,050,214 | A | 9/1991 | Lee | |
| 5,101,191 | A | 3/1992 | MacFadyen | |
| 5,131,048 | A | 7/1992 | Farenelli et al. | |
| 5,164,991 | A | 11/1992 | Johnson et al. | |
| 5,175,770 | A | 12/1992 | Back | |
| 5,255,322 | A | 10/1993 | Farinelli et al. | |
| 5,332,976 | A | 7/1994 | Dünnebacke | |
| 5,361,381 | A | 11/1994 | Short | |
| 5,410,265 | A | 4/1995 | Jain et al. | |
| 5,546,468 | A | 8/1996 | Beard | |
| 5,579,397 | A | 11/1996 | Ikeda et al. | |
| 5,784,472 | A | 7/1998 | Ney et al. | |
| 6,389,139 | B1 * | 5/2002 | Curtis et al. | 381/105 |
| 6,449,348 | B1 * | 9/2002 | Lamb et al. | 379/93.36 |
| 6,596,944 | B1 * | 7/2003 | Clark et al. | 174/113 C |

FOREIGN PATENT DOCUMENTS

| | | | |
|---|---|---|---|
| EP | 777403 | A | 6/1997 |
| FR | 2616288 | A | 12/1988 |
| FR | 2624332 | A | 6/1989 |
| JP | 6021693 | | 2/1985 |

OTHER PUBLICATIONS

Lonstein et al. (Sound & Video Contractor, "Distributed sound systems come of age", Dec. 20, 1993.*
"Jim Tate Stereo Home of Linn Products", *Australian Hi-Fi*, pp 29-31.
"Room Service", *What Hi-Fi*, Jan. 1994, pp. 70-71.
"With A Clue", *Home Entertainment*, Dec. 1995, pp. 61,63,65.
"Cable and the Cutting Edge", Belden *Technical Papers*, Jul. 1997.
S4.3 Multi-Room System Installation Manual, *Systemline*.
Multi Room Sound Installation Considerations, Aug. 1994.
"Multi Room Systems", *Best Buys '95*, pp. 88-89.
Design for Multi Room Display, Caringbah Hi-Fi Pty Ltd. Feb. 1997.
"Distributed Sound Systems Come of Age", *Sound and Video Contractor*, Dec. 1993, pp. 54, 56.
QED Audio Products Ltd., "An Introduction to Streamline", Apr. 1988, Ashford, Middlesex, England.
QED Audio Products Ltd.., Installation Manual, Issue One, Mar. 1989.
What Hi-Fi?, review of Multi-room system, Sep. 1988, table of contents and pp. 127 et seq., Teddington, Middlesex, England.
S4.3 Multi-room system, Installation Manual, undated prior art.
Linn Products Limited, Information Sheet, KNET, Glasgow, Scotland, Mar. 1995.
What Hi-Fi?, "Room Service", Jan. 1994.
The Sunday Times, "Multi-room hi-fi takes control of the house", reprint from May 28, 1995.
Hi-Fi Choice, "Hi-Fi in every room", pp. 38 et seq., May 1995.
Australian Hi-Fi, "Jim Tate Stereo / Home of LinnProducts", cover and pp. 29 et seq., undated prior art.
Knekt Installation Manual, Rev. 2.00, Nov. 18, 1996.
Command Systems Pty. Ltd., "UTP and Video Commander / ZCB0001", Brookvale, N.S.W., Australia, Nov. 14, 2000.
Belden Electronics Division, "Cable and the Cutting Edge", Sydney, Australia, Jul. 1, 1997.
Sound & Video Contractor, "Distributed stereo systems come of age", Dec. 20, 1993.
Stentor, Brochure, Trondheim, Norway, undated prior art.
Audio Systems Design and Installation, Phillip Giddings, 1990, pp. 318, 331, 337.
International Standard ISO/IEC 8877, Second Edition, Nov. 15, 1992, pp. 2, 9.
"Twisted-pair cables for AES/EDU Digital Audio Signals", D.G. Kirby, Audio Engineering Society 96th Convention, Feb. 26 - Mar. 1, 1994, Amsterdam.
Jeff Cherum, "Scottish Rites-Knekt Multi-room System", Home Theater, Mar. 1998 (whole document).
Gold, "Linn kneckt Multi-room System", Grammaphone, Dec. 1996, pp. 198, 200 (whole document).
Lloyd, "Multiroom hi-fi takes control of the home", Times of London, May 28, 1995.
"The Kneckt System", from internet page http://www.linn.co.uk/linn/ss/ssknt.html, published [in Australia] on or before 4:31 PM Feb. 16, 1998; also see http://www.linn.co.uk/ss/ss_knt.reviews.html.
"MRS Multi-room Sound System", from internet page http://www.misdcoast.com.au/bus/me/Mrs.html, published [in Australia] on or before 4:43 PM Feb. 16, 1998.
Home Entertainment Australia Magazine, Issue No. One, 1977 (whole issue—see selected pages).
Wickelgreen, "The Facts about Firewire", IEEE Spectrum [magazine], Apr. 1997, pages 20-25, especially Figs. 1, 2, p. 25.
Kumin, "ADA Multi-room audio system", Audio Video Interiors Magazine, Feb. 1994 4 pages.
DU3 Users Guide, PD-101-4-96, undated prior art.
"High quality media over LANs without sacrificing bandwidth," Audio Media, Jul. 1997, p. 30.
Home Entertainment Australia Magazine, Issue No. One, 1977 (cover plus five selected advertisement pages).
The Knekt System, printout from https://www.linn.co.uk/linn/ss/ss_knt.html dated Feb. 16, 1998, from 4:31 PM to 4:40 PM, four web pages' worth of material (11 pages total).
MRS Multi Room Sound Installation Considerations, Aug. 10, 1994.
Linn Products, Introduction, accessed via http://www.linn.co.uk/spec_sound.cfm on Jan. 26, 2006.
Linn Control, accessed via http://www.linn.co.uk/spec_sound/control.cfm on Jan. 26, 2006.
Linn Knekt, accessed via http://www.linn.co.uk/spec_sound/knekt.cfm on Jan. 26, 2006.
Knekt RCU, accessed via http://www.linn.co.uk/spec_sound/product_display.cfm? ProductID=36&activeNavBar=products&activeSubNavBar=Knekt on Jan. 26, 2006.
Knekt RCU Specification, accessed via http://linfo.linn.co.uk/binaries/A9D547CF-3D72-4532-988D94E8B2D44D9C/Knekt_RCU_InfSht_lores.pdf on Jan. 26, 2006.
Knekt Multi-room Owner's Manual, accessed via http://linfo.linn.co.uk/binaries/B8E1EB21-C738-4663-A9A21629A523F6EA/Knekt_owner_manl_ENGLISH_rev3.pdf on Jan. 26, 2006.
Knenkt Intersekt, accessed via http://www.linn.co.uk/spec_sound/product_display.cfm? ProductID=37&activeNavBar=product&activeSubNavBar=Knekt on Jan. 26, 2006.
Knekt Intersekt, accessed via http://linfo.linn.co.uk/binaries/C2ABBB4F-6723-4526-9A8F665B77E94D40/intersekt_info_rev2.PDF on Jan. 26, 2006.
Knekt Line Driver, accessed via http://www.linn.co.uk/spec_sound/product_display.cmf? ProductID=38&activeNavBar=products&activeSubNavBar=Knekt on Jan. 26, 2006.
Knekt Line Driver Specification, accessed via http://linfo.linn.co.uk/binaries/64D115E8-9FE5-44BF-8FF2ABD1167F0E24/Line_Driver_Spec_Sheet.pdf on Jan. 26, 2006.
Knekt Line Reciever, accessed via http:www.linn.co.uk/spec_sound/product_display.cfm? ProductID=39&activeNavBar=products&activeSubNavBar=Knekt on Jan. 26, 2006.
Knekt Line Receiver Specifications, accessed via http://linfo.linn.co.uk/binaries/5A295169-2B0D-11D4-8DFF009027D395C0/linereceiver_info.pdf on Jan. 26, 2006.
Knekt Roomamp, accessed via http://www.linn.co.uk/spec_sound/product_display.cfm? ProductID=41&activeNavBar=products&ctiveSubNavBar=Knekt on Jan. 26, 2006.
Knekt Roomamp specification, accessed via http://linfo.linn.co.uk/binaries/91E0F632-1A81-4783-B719435AF04A91B8/roomamp_info_rev2.pdf on Jan. 26, 2006.
Knekt Roomamp Press Release, Jul. 1997, accessed via http://www.linn.co.uk/news/press_release_viewer.cfm?PressReleaseUUID=67317FB9%2DFE46%2D11D3%2DBEE70090279FE9F8 on Jan. 26, 2006.

Knekt Sneaky Driver, accessed via http://www.linn.co.uk/spec_sound/product_display.cfm? ProductID=165&activeNavBar=products&activeSubNavBar=Knekt on Jan. 26, 2006.

Knekt Line Driver specifications, accessed via http://linfo.linn.co.uk/binaries/9574EF1D-0C07-11D6-A3640002B33574A8/linedriver_info.pdf on Jan. 26, 2006.

Knekt Sneaky Reciever, accessed via http://www.linn.co.uk/spec_sound/product_display.cfm?ProductID=166&activeNavBAr=products&activeSubNavBAr=Knekt on Jan. 26, 2006.

* cited by examiner

DISTRIBUTED STEREO SYSTEM

TECHNICAL FIELD

This invention concerns a distributed stereo audio system. Distributed stereo audio systems may be used to provide stereo sound to several rooms or areas from a single source of audio signals.

BACKGROUND ART

A typical stereo audio system comprises several audio signal sources such as a CD player and a tuner. The source units are generally arranged in a stack together with a selector and amplifier unit. In use, a signal from a selected source is amplified and provided to speakers which are typically located some distance away from the unit within the same room. The system controls are manually operable switches and dials on the signal sources and amplifier. There is sometimes a hand-held control device which is used to transmit infrared signals to the selector and amplifier unit.

In sophisticated systems several sets of speakers may be mounted in different rooms throughout a house. Sometimes the selector and amplifier unit will be provided with switches to enable different sets of speakers to be activated and deactivated. To power multiple speakers from a single amplifier an impedance matching device is also required.

The amplifier's volume control, which controls the volume level in the main room, also controls the volume level of the speakers in remote rooms. The remote rooms may have an attenuator device to reduce volume level but this attenuator can only reduce the volume below the level set by the amplifier. The attenuator cannot increase the amplifier's output.

The quality of the components and the weight and quality of the cabling can easily affect the quality of the sound output by the speakers. These systems also require specialist knowledge in the installation of the cabling and the audio components.

SUMMARY OF THE INVENTION

The invention is a distributed stereo audio system, including: two or more speakers for the broadcast of stereo audio signals; a source of stereo audio signals; a stereo amplifier to amplify stereo audio signals and drive the speakers; and a mains operated electrical power supply to provide power to the amplifier. The amplifier is located in the same room as the speakers, and remote from the signal source and power supply. The amplifier is connected to the signal source and power supply by means of a category 5 four pair twisted cable which provides, in respective conductors of the twisted pairs, right channel audio signals from the signal source to the amplifier, left channel audio from the signal source to the amplifier, and DC power from the power supply to the amplifier.

The right channel audio, left channel audio and DC power may be provided in respective twisted pairs.

This system enables decentralisation of amplification, and permits the amplifier to be installed remote from the signal source and close to the speakers, reducing speaker cable loss and increasing total system damping factor. The remote amplifier does not need to be positioned close to a voltage source since it receives its power via the category 5 four pair twisted cable.

The cabling is very simple and easy to install. One CAT5, or similar, cable connects the source of audio signals, to each room or zone. This cable carries audio signal, system power, and if required, data and status. Digital systems can also carry video transmission. More of the cables can be laid in parallel if higher power or bi-amplification is required.

The cabling can be adapted to many different configurations. It is possible to install it into every major room in new homes. Once the cabling is installed the system can be configured in many different ways. It could start as a one-room system and be changed and upgraded to an audiophile standard multi-zone system feeding individual source selection to each room utilising the same cabling.

The cabling is capable of adapting to new technologies and system upgrades without the need to re-cable when upgrades are required; for instance, it can also be used to transmit digital audio, video and control commands.

Remote amplifier and speaker sets may be positioned in several rooms, and may receive signals from a single source of audio signals. Where the source provides a selection of components, such as radio or CD, it is also possible for different audio signals to be provided to different rooms. The volume may be set differently, up or down, in each room.

The remote amplifiers are integrated circuit amplifiers. As a result of not requiring built-in power supplies they may be compact, and they may be constructed to fit into a standard electrical light switch housing or be incorporated into a speaker box or in-wall or in-ceiling speaker. A suitable example is the Silicon Monolithic, Bipolar Linear Integrated Circuit, TA8216H, dual audio power amplifier.

The remote amplifiers can be powered by low cost plug packs or by dedicated audiophile power supplies located at the audio source, where mains power is easily accessible.

The remote amplifiers' output levels may be controlled by the output levels of the source components, or a manual volume control maybe included with respective remote amplifiers. Alternatively, a hand-held remote control may by provided for volume control, among other things. In this case, the remote control may transmit infrared signals to a receiver mounted with a remote amplifier. Where a remote amplifier is mounted inside a standard electrical light fitting the fascia plate may include an infrared receiver. The fascia plate may also include status indicators for the amplifier and the audio signal source components.

Infrared signals received by a remote amplifier may be transmitted to the source components through a fourth twisted pair in the category 5 cable. The signals may be modulated before transmission to an infrared emitter which directly controls the audio components, or they may be demodulated and provided as data signals to those components.

The system can also carry control data in the single cable to control other remote controllable items which are located in the same areas or those which can be incorporated into the single wiring system. Infrared is now a common data language. Many domestic appliances are controlled by infrared remote control. The remote infrared receivers may relay commands for all infrared devices operating between 38–500 kHz.

The remote amplifiers may accept standard line level signals from the audio source components, or speaker outlet of a master amplifier which may be matched to the audio source, or sources, and may be located with them. In other words, the remote amplifiers may be driven by either a low impedance (4 to 16 ohm) speaker level signal, or high impedance (10 k ohm) line level signal.

The remote amplifiers may include a switchable muting system, and they may include an adjustable input level trim device.

A high input impedance at the remote amplifiers will cause any inducted line signals to be conducted back to the lower impedance of the audio source, reducing induced system noise at the amplifier. High impedance will also allow many remote amplifiers to be run from a single audio source with no sonic detriment. Multiple pairs of speakers may be driven from a single audio source in this way without the need for speaker impedance matching devices.

The output from the remote amplifiers is sufficient to drive a pair of hi-fi speakers, 4 to 16 ohm, at a reasonable sound level for most domestic requirements; typically 90–100 dB unweighted. The remote amplifiers do not require fused output protection.

BRIEF DESCRIPTION OF THE DRAWING

Examples of the invention will now be described with reference to the accompanying drawings, in which.

BEST MODES FOR CARRYING OUT THE INVENTION

Figure 1:
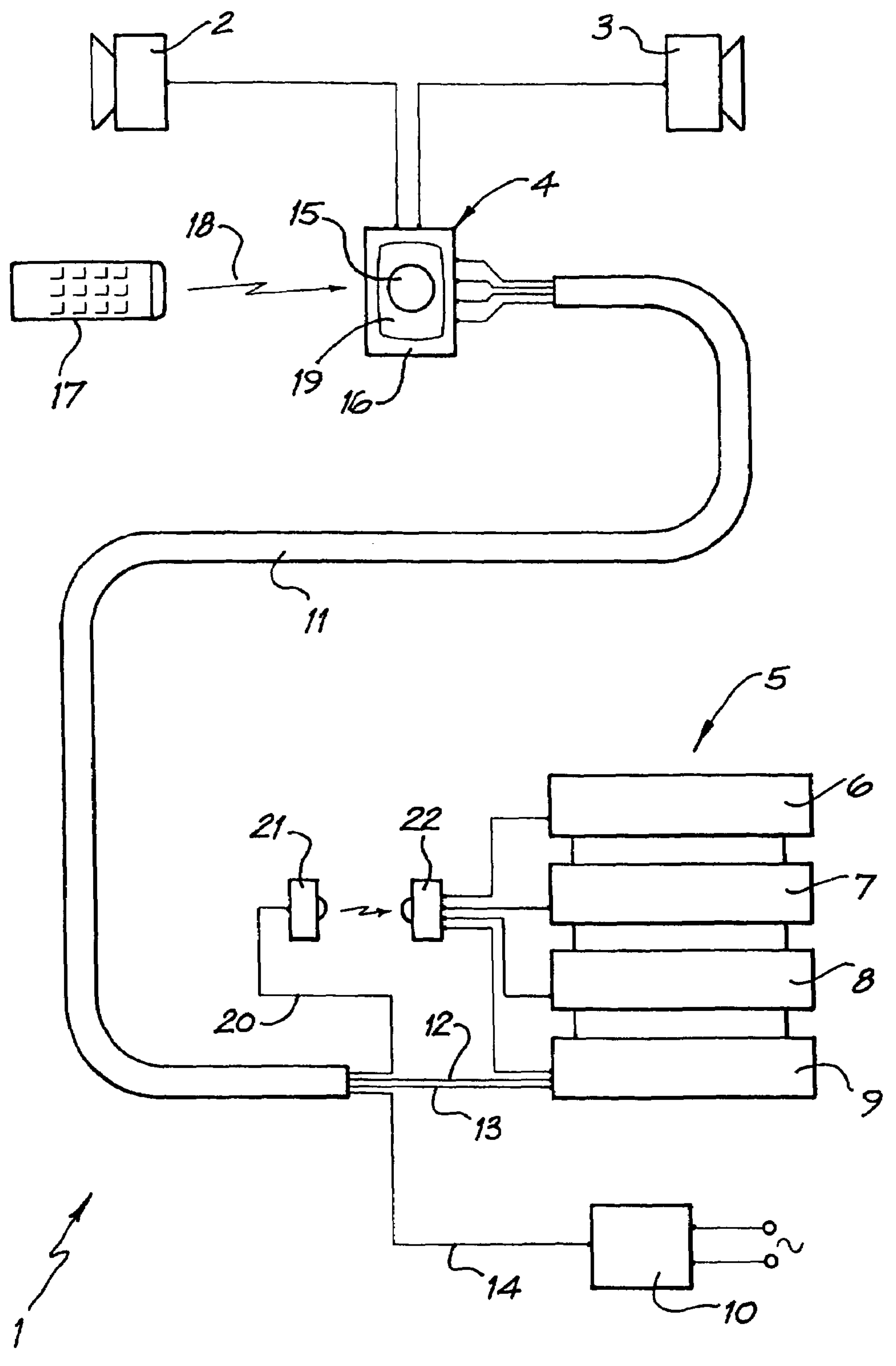
FIG. 1 is a schematic diagram of a first example.

Referring first to FIG. 1, the distributed stereo audio system 1 comprises two speakers 2 and 3 connected to an amplifier 4. The amplifier 4 is housed in a standard electrical light switch housing in the same room as the speakers.

In another room, a source of audio signals 5 comprises a CD player 6, a tape recorder 7, a VCR 8 and a source selector 9. A power supply 10 provides power from the mains to each amplifier 4.

The amplifier 4 is connected to the signal source—and power supply 10 by means of a category 5 four pair twisted cable 11. One of the twisted pairs 12 provides the right audio signal from the source to amplifier 4. Another twisted pair 13 provides the left audio signal. A third twisted pair 14 provides power from power supply 10 to the amplifier 4.

In use amplifier 4 amplifies the left and right standard line level signals and supplies them to the speakers 2 and 3 respectively. The amplifier is controlled by operation of a potentiometer 15 mounted on its fascia plate 16.

Amplification may also be controlled by means of a hand-held remote controller 17 which transmits infrared signals 18 to a receiver 19 mounted in fascia plate 16. The fascia plate may include displays indicating the status of the amplifier and, if required, the components of the source. The fascia plate may also be used as a key-pad to transmit control commands to the sources.

Infrared signals may be transmitted, either before or after demodulation, from amplifier 4 back to source 5 using the fourth twisted pair 20 in category 5 cable 11. The infrared signals may be used to control the source directly. Alternatively, they may be used to retransmit the control signals using transmitter 21 to an infrared receiver 22 associated with the source.

Amplifier 4 is designed around a single chip amplifier, and has high input impedance. This enables several amplifiers to be mounted in different rooms to amplify signals from the same source 5 for speaker sets in each of those rooms, the Silicon Monolithic, Bipolar Linear Integrated Circuit, TA8216H, dual audio power amplifier is used for this purpose.

In each room the sound broadcast may be from the same component of the source, or from different components of the source. Further the amplification level may be different in each room.

Figure 2:
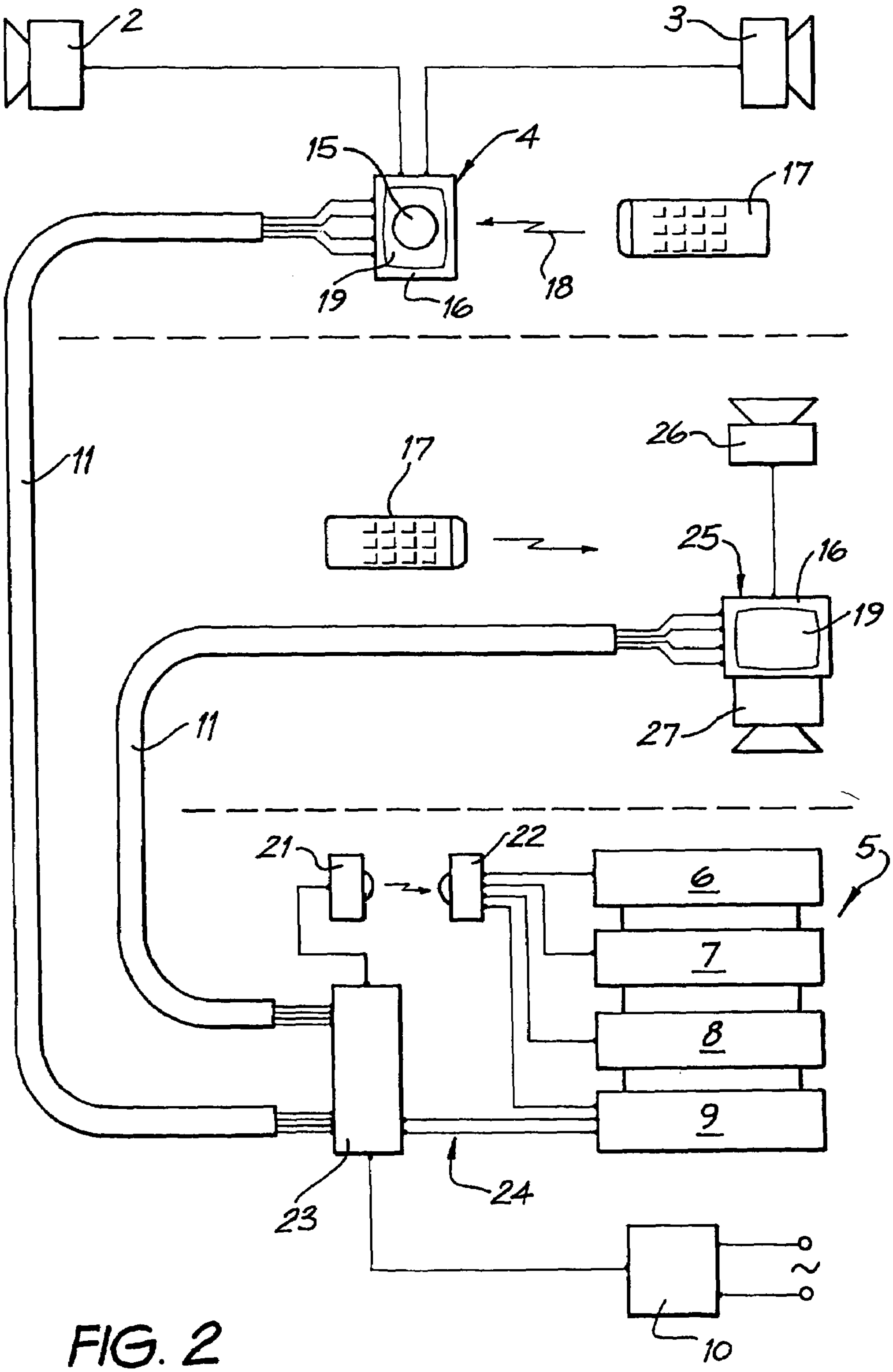
FIG. 2 is a schematic diagram of a second example.

Referring now to FIG. 2, a slightly more complicated system will be described. In this system a connecting block 23 is used to interconnect the source of audio signals 5, the power supply 10, several category 5 four pair twisted cables 11 (two of which are shown), and the infrared emitter 21. The source selector 9 provides audio input, at line or speaker level, to the block 23 along lines 24. The block then outputs these signals to respective twisted pairs of the category 5 cables 11, together with electrical power. One of the category 5 cables is connected as before, but the other terminates in an amplifier 25 mounted with one of a pair of ceiling mounted speakers 26 and 27 in another room. This amplifier module may be equipped with an infrared receiver 19 in its facia plate, and control signals may be transmitted back to base as before.

Although the invention has been described with reference to a particular example, it should be appreciated that it may be exemplified in different forms. For instance, the source audio signal can come from a main amplifier or any line level output or amplifier speaker output. It can even have its own input switching or work in parallel with line level outputs connected to an amplifier. A line driver of some kind may be used but it is not necessarily required. No impedance matching devices are required. For more sophisticated systems each remote amplifier may have its own source selection but this is not necessarily required.

During construction of a new building a facility for stereo broadcast can be economically installed into every major room. A four pair twisted cable (CAT5 or equivalent) is laid from a common control point to a point in each room where a remote amplifier may be installed. A loop wiring system may be used, however, this is not preferred since it may restrict the system's flexibility and power capability. Short lengths of speaker cable may be installed to speaker points in the walls or ceilings or wired directly to the speaker terminals. Using this cabling it is possible to install a remote amplifier into any room as and when required. More sophisticated multi-zone systems can be installed using the same cabling system.

Wiring at each end of the cable is a simple 8 way colour encoded connection. (It can also be a standard plug connector). No consideration has to be given to impedance matching, multiple modules can be run from the main system amplifier or a dedicated input selector or a single source component, eg. a CD player via line level. The volume level is infinitely variable and the main systems volume level does not affect the speakers in remote rooms. No remote mains power source is required.

A connecting block may be provided to interconnect the power supply, audio signal sources, main amplifier, infrared emitter to control the local sources and the remote amplifier and speaker sets. A four pair twisted (CAT5) cable is used to connect the connecting block with every remote amplifier.

In the Underwriters Labs (UL) Level classification system, there are 5 levels of increasing quality cabling.

In work paralleling UL's efforts, the American National Standards Institute's (ANSI) Electronic Industry Association/Telecommunication Industry Association (EIA/TIA) has developed similar standards to rate UTP.

The UL system harmonised with the EIA/TIA category system, and UL categories 3–5 now correspond exactly to EIA/TIA 568A categories.

EIA/TIA 568A incorporates all of the relevant areas of 568, TSB-36, TSB-40A, and TSB-53. The standard covers 100 ohm UTP, 150 ohm STP, and fibre optic cabling. The EIA/TIA category rating system identifies categories 3, 4 and 5 for data applications.

Category 5 applies to UTP cables and associated connecting hardware with transmission characteristics up to 100 mhz. Its application is ATM over copper TP-PMD 100Base-X.

Most field test equipment verify category 5 conformance by checking the link's performance against EIA/TIA 568A Annex E requirements.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A distributed stereo audio system, including: two or more speakers for the broadcast of stereo audio signals, a source of stereo audio signals, a stereo amplifier to amplify stereo audio signals and drive the speakers, and a mains operated electrical power supply to provide power to the amplifier; where the amplifier is located in the same room as the speakers, and remote from the signal source and power supply; and where the amplifier is connected to the signal source and power supply by means of a category 5 four pair twisted cable which provides, in respective conductors of the twisted pairs, right channel audio signals from the signal source to the amplifier, left channel audio from the signal source to the amplifier and DC power from the power supply to the amplifier.

2. A distributed stereo audio system according to claim 1, wherein amplifier and speaker sets in several rooms receive signals from a single source of audio signals.

3. A distributed stereo audio system according to claim 1, wherein the source provides a selection of components, selected from any one of a tape recorder, VCR, radio or CD, and different audio signals are provided to different rooms.

4. A distributed stereo audio system according to claim 1, 2 or 3, wherein the volume is set differently in each room.

5. A distributed stereo audio system according to claim 1, 2, or 3, wherein the amplifier is based on an integrated circuit amplifier.

6. A distributed stereo audio system according to claim 5, wherein the amplifier is constructed to fit into a standard electrical light switch housing.

7. A distributed stereo audio system according to claim 1, 2 or 3, wherein the amplifier output level is controlled by the output level of the source of stereo audio signals.

8. A distributed stereo audio system according to claim 1, 2 or 3, wherein a manual volume control is included with the amplifier.

9. A distributed stereo audio system according to claim 1, 2 or 3, wherein a hand-held remote control is provided to transmit infrared signals to a receiver mounted with the amplifier.

10. A distributed stereo audio system according to claim 9, wherein the amplifier is mounted with a speaker.

11. A distributed stereo audio system according to claim 9, wherein the amplifier is mounted inside a standard electrical light fitting having a fascia plate that includes an infrared receiver.

12. A distributed stereo audio system according to claim 11, wherein the fascia plate also includes status indicators for the amplifier and the source of stereo audio signals.

13. A distributed stereo audio system according to claim 9, wherein infrared signals received by the amplifier are transmitted to the source of stereo audio signals components through a fourth twisted pair in the category 5 cable.

14. A distributed stereo audio system according to claim 13, wherein the infrared signals are modulated before transmission to an infrared emitter which directly controls the source of stereo audio signals.

15. A distributed stereo audio system according to claim 13, wherein the infrared signals are demodulated and provided as data signals to the source of stereo audio signals.

16. A distributed stereo audio system according to claim 1, wherein the amplifier accepts standard line level signals from the source of stereo audio signals.

17. A distributed stereo audio system according to claim 1, wherein the amplifier accepts speaker signals from another amplifier.

18. A distributed stereo audio system according to claim 1, wherein the amplifier includes a switchable muting system.

19. A distributed stereo audio system according to claim 1, wherein the amplifier includes an adjustable input level trim device.

20. A distributed stereo audio system according to claim 4, wherein the amplifier is based on an integrated circuit amplifier.

21. A distributed stereo audio system according to claim 20, wherein the amplifier is constructed to fit into a standard electrical light switch housing.

22. A distributed stereo audio system according to claim 11, wherein the infrared signals are modulated before transmission to an infrared emitter which directly controls the source of stereo audio signals.

23. A distributed stereo audio system according to claim 22, wherein the amplifier accepts standard line level signals from the source of stereo audio signals.

24. A distributed stereo audio system according to claim 12, wherein the infrared signals are modulated before transmission to an infrared emitter which directly controls the source of stereo audio signals.

25. A distributed stereo audio system according to claim 24, wherein the amplifier accepts standard line level signals from the source of stereo audio signals.

* * * * *

UNITED STATES PATENT AND TRADEMARK OFFICE

CERTIFICATE OF CORRECTION

PATENT NO. : 7,181,023 B1 
APPLICATION NO. : 09/485657
DATED : February 20, 2007
INVENTOR(S) : Leonard Colin Andrews and Andrew Chartres Goldfinch It is certified that error appears in the above-identified patent and that said Letters Patent is hereby corrected as shown below:

1) On the Title Page, under section (30) (Foreign Application Priority Data):

The priority application date is changed FROM August 15, 1998 TO August 15, 1997.

2) At column 1, before the Technical Field, a cross-reference to the underlying foreign priority application is inserted as follows:

-- CROSS-REFERENCE TO RELATED APPLICATIONS

This application is based on and claims the priority benefit of Australian Patent Application PO 8621 filed August 15, 1997. --.

Signed and Sealed this

Eleventh Day of May, 2010

David J. Kappos
*Director of the United States Patent and Trademark Office*